United States Patent [19]

Nakayama

[11] Patent Number: 5,256,915
[45] Date of Patent: Oct. 26, 1993

[54] COMPOUND SEMICONDUCTOR INTEGRATED CIRCUIT

[75] Inventor: Yoshiro Nakayama, Kawasaki, Japan

[73] Assignee: Fujitsu Limited, Kawasaki, Japan

[21] Appl. No.: 817,092

[22] Filed: Jan. 6, 1992

[30] Foreign Application Priority Data

Jan. 8, 1991 [JP] Japan ................................. 3-305

[51] Int. Cl.⁵ .......................................... H03K 11/094
[52] U.S. Cl. ................................... 307/450; 307/448; 257/368
[58] Field of Search ................ 307/448, 450, 443; 357/23.3, 23.6, 23.9, 22 I, 22 K

[56] References Cited

U.S. PATENT DOCUMENTS

| | | | |
|---|---|---|---|
| 4,816,705 | 3/1989 | Ohba et al. | 307/450 |
| 4,888,626 | 12/1989 | Davey | 357/22 |
| 4,937,474 | 6/1990 | Sitch | 307/450 |
| 4,958,089 | 9/1990 | Fitzpatrick et al. | 307/450 |

FOREIGN PATENT DOCUMENTS

| | | |
|---|---|---|
| 0011477 | 5/1980 | European Pat. Off. |
| 52-93282 | 5/1977 | Japan. |
| 52-149481 | 12/1977 | Japan. |

OTHER PUBLICATIONS

Paul L. Greiling, "High-Speed Digital IC Performance Outlook," *IEEE Transactions on Microwave Theory and Techniques*, vol. 35, No. 3, Mar. 1987, New York, N.Y., pp. 245-259.

Patent Abstracts of Japan, vol. 12, No. 389 (E-669)(3236) Oct. 17, 1988 & JP-A-63 131581 (Hitachi Ltd.) Jun. 4, 1988.

Primary Examiner—Edward P. Westin
Assistant Examiner—Andrew Sanders
Attorney, Agent, or Firm—Staas & Halsey

[57] ABSTRACT

A semiconductor integrated circuit produces a driving signal for driving a load. The semiconductor integrated circuit includes a compound semiconductor substrate, a logic part including at least a first field effect transistor formed on the compound semiconductor substrate for outputting a first signal, and a driver part including at least a second field effect transistor formed on the compound semiconductor substrate and outputting the first signal through the second field effect transistor as a driving signal. The first field effect transistor is a self-aligned type field effect transistor having a first gate electrode and first and second impurity regions formed in self-alignment to the first gate electrode. The second field effect transistor is a non-self-aligned type field effect transistor having a second gate electrode and third and fourth impurity regions formed in non-self-alignment to the second gate electrode.

7 Claims, 6 Drawing Sheets

FIG.5A  NON-SELF-ALIGNED TYPE FET
GATE ELECTRODE

FIG.5B  SELF-ALIGNED TYPE FET
GATE ELECTRODE

FIG.6

COMPOUND SEMICONDUCTOR INTEGRATED CIRCUIT

BACKGROUND OF THE INVENTION

The present invention generally relates to semiconductor integrated circuits, and more particularly to a compound semiconductor integrated circuit for producing a relatively large output voltage.

Generally, a thin active layer is used to reduce the pinch-off voltage of the field effect transistor (FET). However, when a compound semiconductor material such as GaAs is used and a surface depletion layer is introduced due to the surface levels, the surface depletion layer occupies an increasing amount, or proportion, of increases the channel increases and the channel becomes correspondingly narrower. As a result, the stray resistance, particularly the source resistance $R_s$ increases, thereby reducing the mutual conductance. Accordingly, various measures are taken to reduce the effects of the surface depletion layer in order to minimize the stray resistance.

One such measure involves the so-called self-aligned type FET. The self-aligned type FET has an impurity layer of high impurity concentration formed in self-alignment with the gate electrode. The stray resistance $R_s$ can be made extremely small because the impurity layer reaches the vicinity of the gate.

Figure 1:
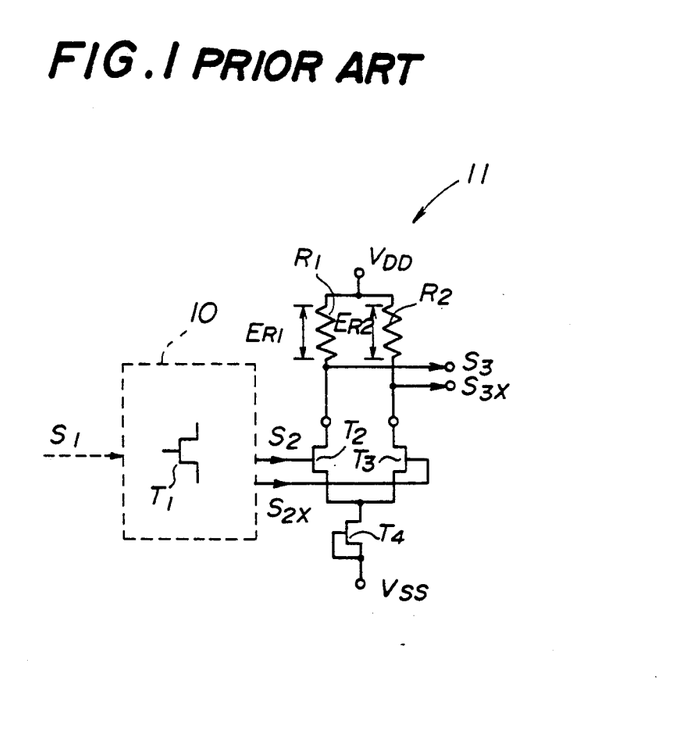
FIG. 1 is a circuit diagram showing an example of a conventional semiconductor integrated circuit.

FIG. 1 shows an example of a conventional semiconductor integrated circuit. In FIG. 1, a logic part 10 forms an internal circuit, and a driver part 11 drives a load. The logic part 10 converts an internal signal $S_1$ into a logic signal $S_2$ and an inverted signal $S_{2X}$ of the logic signal $S_2$. The driver part 11 amplifies the logic signals $S_2$ and $S_{2X}$ into driving signals $S_3$ and $S_{3X}$ which are sufficiently large to drive the load. The logic part 10 includes a self-aligned type FET $T_1$. On the other hand, the driver part 11 includes self-aligned type FETs $T_2$ through $T_4$ and resistors $R_1$ and $R_2$ which are connected as shown.

The amplitudes of the driving signals $S_3$ and $S_{3X}$ are determined by terminal voltages $E_{R1}$ and $E_{R2}$ developed across the respective resistors $R_1$ and $R_2$ in relation to the switching operation of the respectively associated FETs $T_2$ and $T_3$. For example, the amplitude of the driving signal $S_3$ is obtained by subtracting the drain voltage $V_{D2ON}(=V_{DD}-E_{R1})$ of the FET $T_2$ when it is ON from the drain voltage $V_{D2OFF}(=V_{DD})$ of the FET $T_2$ when it is OFF, that is, the amplitude of the driving signal $S_3$ is given by $E_{R1}$.

However, since the FETs $T_2$ through $T_4$ used in the driver part 11 of the conventional semiconductor integrated circuit are of the self-aligned type, the amplitude of the driving signals $S_3$ and $S_{3X}$ is only 5 V at the maximum, and only 3 V if safety factor is taken into consideration. For this reason, there is a problem in that the conventional semiconductor integrated circuit cannot be used to drive a load which requires a driving signal which is greater than 5 V.

In other words, in order to make the amplitude of the driving signals $S_3$ and $S_{3X}$ greater than 5 V in FIG. 1, it is necessary to set the potential difference of the two power source voltages $V_{DD}$ and $V_{SS}$ to at least 10 V or greater. But if the potential difference of the two power source voltages $V_{DD}$ and $V_{SS}$ is set to 10 V or greater, this potential difference of 10 V or greater is applied across the drain and source of the FET $T_2$ (or $T_3$) which is OFF. Since the drain withstand voltage of the self-aligned type FET is in the range of 4 V to 6 V at the most, the FET $T_2$ (or $T_3$) breaks down permanently in this case.

It is conceivable to use non-self-aligned FETs in the driver part 11 in order to obtain a drain withstand voltage higher than that obtainable by the self-aligned type FETs $T_2$ through $T_4$. However, in the case of the self-aligned type FET and the non-self-aligned type FET having the same gate electrode length, the gap between the two impurity regions is much smaller for the self-aligned type FET. For this reason, if the driver part 11 uses the non-self-aligned type FETs having the same gap between the two impurity regions as the self-aligned type FETs $T_2$ through $T_4$ in order to obtain the same performance, the gate electrode length of each non-self-aligned type FET must be made extremely small. However, the gate electrode length of each of the self-aligned type FETs $T_2$ through $T_4$ is relatively small to start with, when the driver part 11 is formed as an integrated circuit having a satisfactorily high integration density; thus, and it is extremely difficult to further reduce the electrode length of the non-self-aligned type FET compared to the corresponding gate electrode length of the self-aligned type FET. On the other hand, the gate electrode length of the non-self-aligned type FET must be increased to increase the gap between the two impurity regions in order to improve the drain withstand voltage, but this contradicts to the need to decrease the gap in order to obtain the same performance as the self-aligned type FET. Therefore, the above described problem cannot be eliminated by merely using non-self-aligned type FETs in the driver part 11.

SUMMARY OF THE INVENTION

Accordingly, it is a general object of the present invention to provide a novel and useful semiconductor integrated circuit in which the problems described above are eliminated.

Another and more specific object of the present invention is to provide a semiconductor integrated circuit for outputting a driving signal for driving a load, comprising a compound semiconductor substrate, a logic part including at least a first field effect transistor formed on the compound semiconductor substrate for outputting a first signal, and a driver part, coupled to the logic part and including at least a second field effect transistor formed on the compound semiconductor substrate and outputting the first signal through the second field effect transistor as a driving signal, where the first field effect transistor is a self-aligned type field effect transistor having a first gate electrode and first and second impurity regions formed in self-alignment to the first gate electrode and the second field effect transistor is a non-self-aligned type field effect transistor having a second gate electrode and third and fourth impurity regions formed in non-self-alignment to the second gate electrode. According to the semiconductor integrated circuit of the present invention, it is possible to obtain a relatively high drain-source withstand voltage for the second field effect transistor, thereby making it possible to obtain a driving signal having an amplitude of 5 V or greater.

Other objects and further features of the present invention will be apparent from the following detailed description when read in conjunction with the accompanying drawings.

DESCRIPTION OF THE PREFERRED EMBODIMENTS

Figure 2:
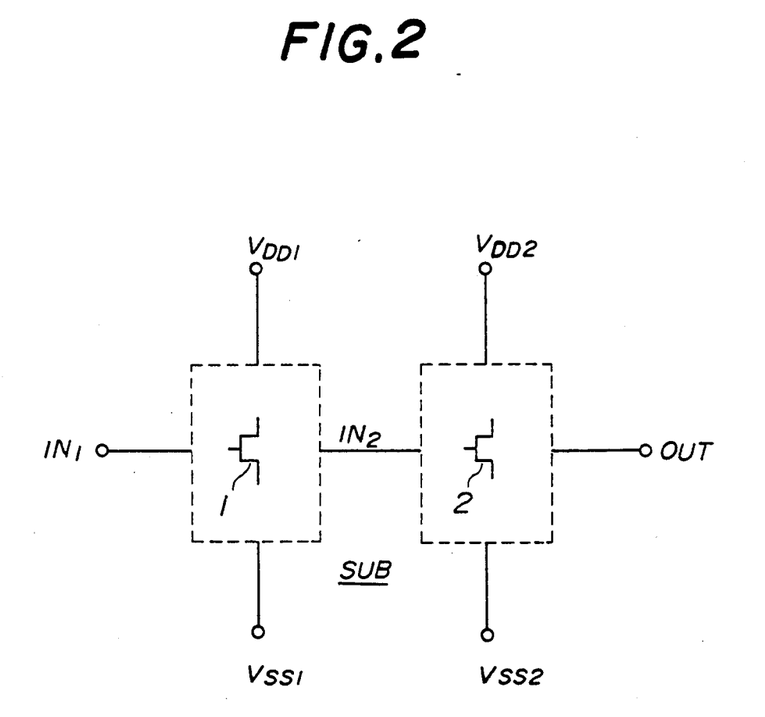
FIG. 2 is a diagram for explaining an operating principle of the present invention.

First, a description will be given of the operating principle of the present invention, by referring to FIG. 2. FIG. 2 shows a first FET 1 and a second FET 2 which are formed on a common compound semiconductor substrate SUB. The first FET 1 has an impurity layer of high impurity concentration formed in self-alignment with the gate electrode. On the other hand, the second FET 2 has an impurity layer of high impurity concentration formed in an isolated manner from the gate electrode. An input voltage $IN_1$ is applied to the first FET 1, and an output voltage $IN_2$ of the first FET 1 is supplied to the second FET 2 which produces an output voltage OUT. This output voltage OUT is used as a driving signal for driving a load (not shown).

In FIG. 2, $V_{DD1}$ and $V_{SS1}$ respectively denote the high and low potential side power source voltages applied to the first FET 1, and $V_{DD2}$ and $V_{SS2}$ respectively denote the high and low potential side power source voltages applied to the second FET 2.

According to the present invention, the load is driven by the output voltage OUT of the second FET 2 which is of the non-self-aligned type. A FET having a lightly doped drain (LDD) structure is one example of the non-self-aligned type FET. In a FET having the LDD structure, the distance between the drain and source is long and the drain-source withstand voltage is large, e.g., approximately 10 V to 15 V. Hence, the potential difference between the power source voltages $V_{DD2}$ and $V_{SS2}$ can be made 10 V or greater provided that it is within the limit of the drain-source withstand voltage, and the amplitude of the output (driving) voltage OUT can be made 5 V or greater.

Figure 3:
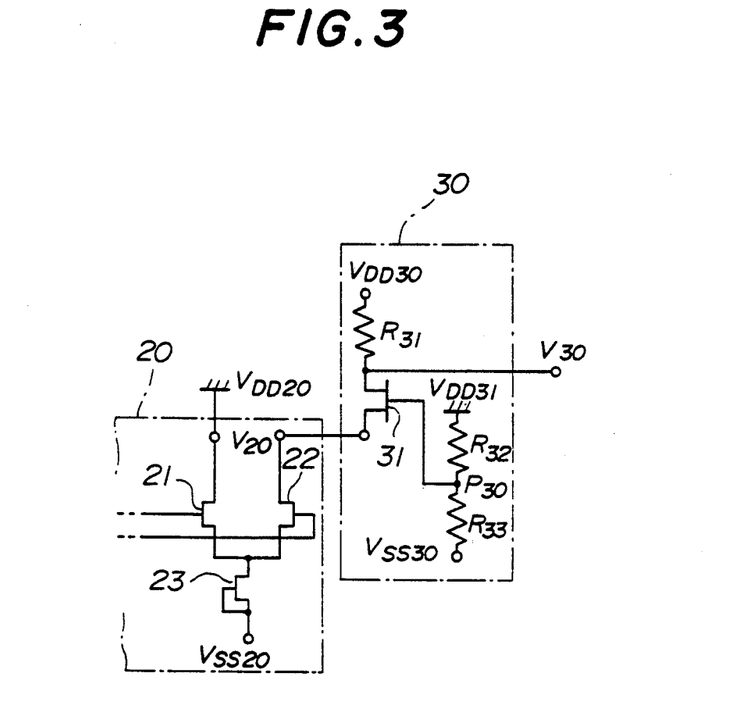
FIG. 3 is a circuit diagram showing an embodiment of a semiconductor integrated circuit according to the present invention.

Next, a description will be given of an embodiment of the semiconductor integrated circuit according to the present invention, by referring to FIGS. 3, 4A and 4B. FIG. 3 shows a circuit diagram of the embodiment, FIG. 4A shows a cross section of a non-self-aligned type FET of the embodiment, and FIG. 4B shows a cross section of a self-aligned type FET of the embodiment.

In FIG. 3, the semiconductor integrated circuit includes a logic part 20 and a driver part 30. The logic part 20 includes three self-aligned type FETs 21, 22 and 23. The sources of the FETs 21 and 22 are connected in common to the drain of the FET 23, and the gate and the source of the FET 23 are respectively connected to the low potential side power source $V_{SS20}$ which supplies a power source voltage $V_{SS20}$ of $-5.2$ V, for example. In addition, the drain of the FET 21 is connected to the high potential side power source $V_{DD20}$ which supplies a power source voltage $V_{DD20}$ of 0 V, for example, and an output voltage $V_{20}$ is obtained from the drain of the FET 22.

On the other hand, the driver part 30 includes one non-self-aligned type FET 31 and resistors $R_{31}$, $R_{32}$ and $R_{33}$. The source of the FET 31 is connected to the drain of the FET 22, and the drain of the FET 31 is coupled to a high potential side power source $V_{DD30}$ via the resistor $R_{31}$. The gate of the FET 31 is connected to a node $P_{30}$ which connects the resistors $R_{32}$ and $R_{33}$. In addition, the resistor $R_{32}$ is connected to a high potential side power source $V_{DD31}$, and the resistor $R_{33}$ is connected to a low potential side power source $V_{SS30}$. A driving voltage $V_{30}$ for driving a load (not shown) is output from the drain of the FET 31.

Figure 4A:
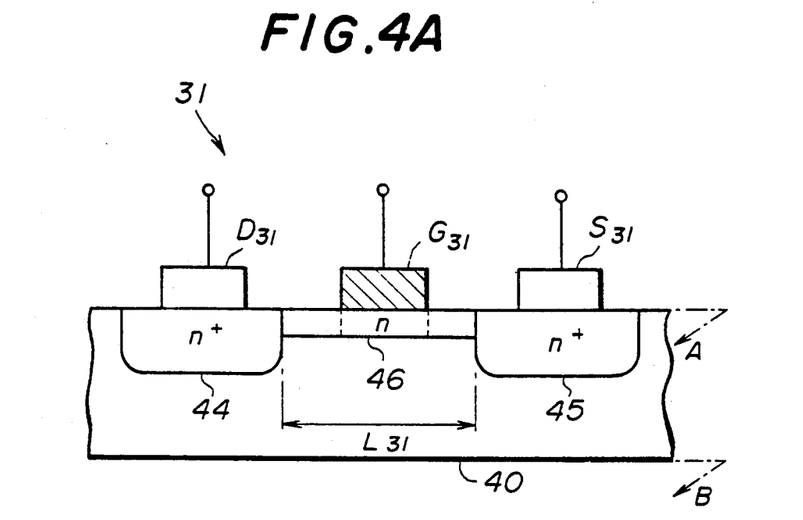
FIGS. 4A and 4B cross sectional views respectively showing a non-self-aligned type FET and a self-aligned type FET of the embodiment.
Figure 4B:
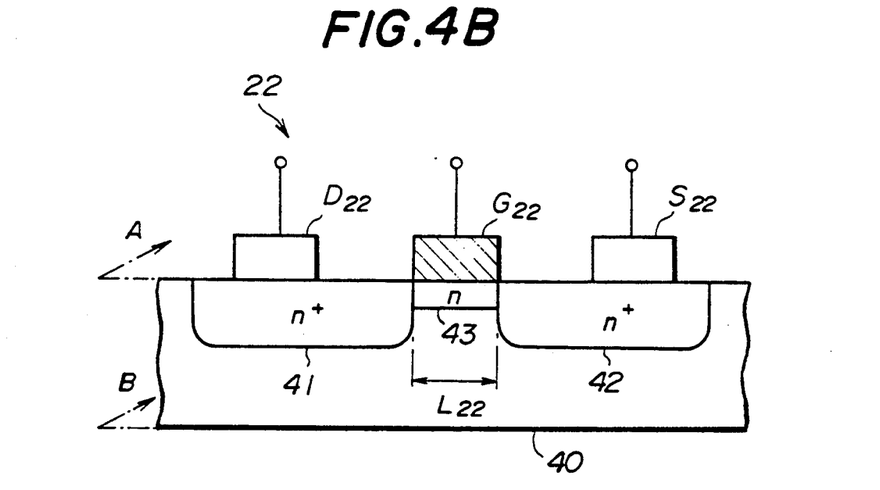

FIG. 4A shows the cross section of the non-self-aligned type FET 31 of the driver part 30. On the other hand, FIG. 4B shows the cross section of the self-aligned type FET of the logic part 20. For example, it is assumed for the sake of convenience that this self-aligned type FET is the FET 22. The FETs 31 and 22 are formed on a common compound semiconductor substrate 40 which is made of GaAs, for example. In other words, the FETs of the logic part 20 and the driver part 30 are formed on the same chip. In FIGS. 4A and 4B, "A" and "B" denote connections.

The self-aligned type FET 22 includes a drain electrode $D_{22}$, a gate electrode $G_{22}$ and a source electrode $S_{22}$. Two impurity regions 41 and 42 each have a high impurity concentration and are formed in self-alignment to the gate electrode $G_{22}$. In addition, a channel region 43 is formed immediately below the gate electrode $G_{22}$ in a gap $L_{22}$ between the impurity regions 41 and 42.

The non-self-aligned type FET 31 includes a drain electrode $D_{31}$, a gate electrode $G_{31}$ and a source electrode $S_{31}$. Two impurity regions 44 and 45 having a high impurity concentration are formed in an isolated manner from the gate electrode $G_{31}$. In addition, a channel region 46 is formed immediately below the gate electrode $G_{31}$ in a gap $L_{31}$ between the impurity regions 44 and 45.

The biggest structural difference between the self-aligned type FET 22 and the non-self-aligned type FET 31 is the different gaps $L_{22}$ and $L_{31}$ between the two impurity regions. For example, if it is assumed that the length of the gate electrode is approximately the same for the two FETs 22 and 31, the gap $L_{22}$ is always narrower than the gap $L_{31}$.

The gap between the two impurity regions is one of the major factors which determine the drain-source withstand voltage of the FET, and the withstand voltage can be improved by increasing this gap.

The drain-source withstand voltage of the non-self-aligned type FET 31 is more than two times the drain-source withstand voltage of the self-aligned type FET 22. Generally, the drain-source withstand voltage of self-aligned type FET is 4 V to 6 V, while the drain-source withstand voltage of the non-self-aligned type FET is 10 V to 15 V.

Hence, according to this embodiment, the source-drain voltage when the FET 31 is OFF can be increased to 10 V or greater because the FET 31 which has the large withstand voltage is used in the driver part 30, compared to approximately 5 V in the conventional case. As a result, the amplitude of the driving voltage $V_{30}$ which is obtained from the drain of the FET 31 can be made 5 V or greater.

Figure 5A:
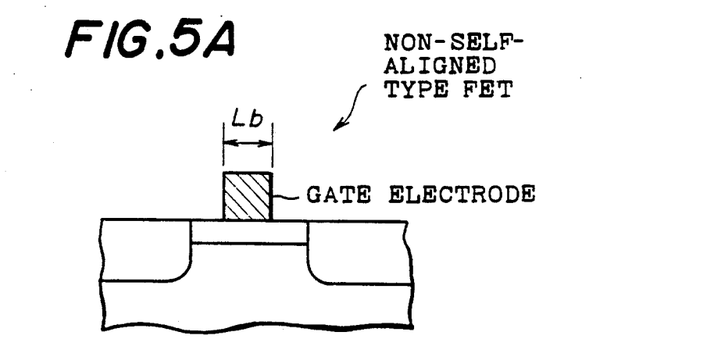
FIGS. 5A and 5B are cross sectional views for respectively explaining gate electrode lengths of non-self-aligned and self-aligned type FETs.
Figure 5B:
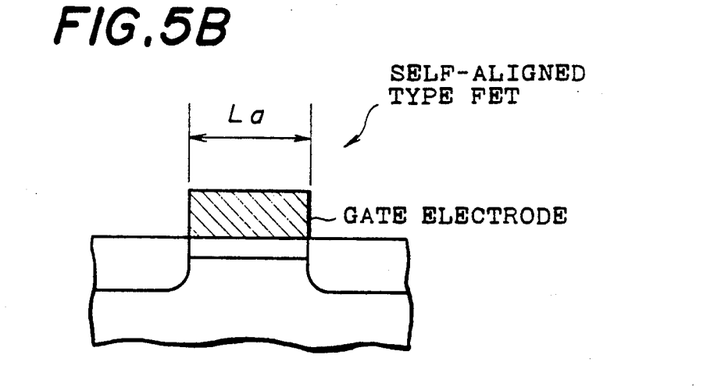

When the non-self-aligned type FET 31 is used, the source resistance $R_2$ in particular becomes large because of the wide gap $L_{31}$, and this large source resistance $R_s$ may cause undesirable effects on the operating speed of the circuit. Hence, it is desirable to make the gate electrode length $L_a$ of the self-aligned type FET as small as possible as shown in FIG. 5B, and to also make the gate electrode length $L_b$ of the non-self-aligned type FET as small as possible as shown in FIG. 5A. Generally, the limit of the minimum gate electrode length $L_a$ is approximately 0.8 μm, while the limit of the minimum gate electrode length $L_b$ is approximately 0.25 μm. Hence, the substantial channel length of the non-self-aligned type FET can be reduced by the extremely small gate electrode length $L_b$, thereby making it possible to improve the operating speed.

Figure 6:
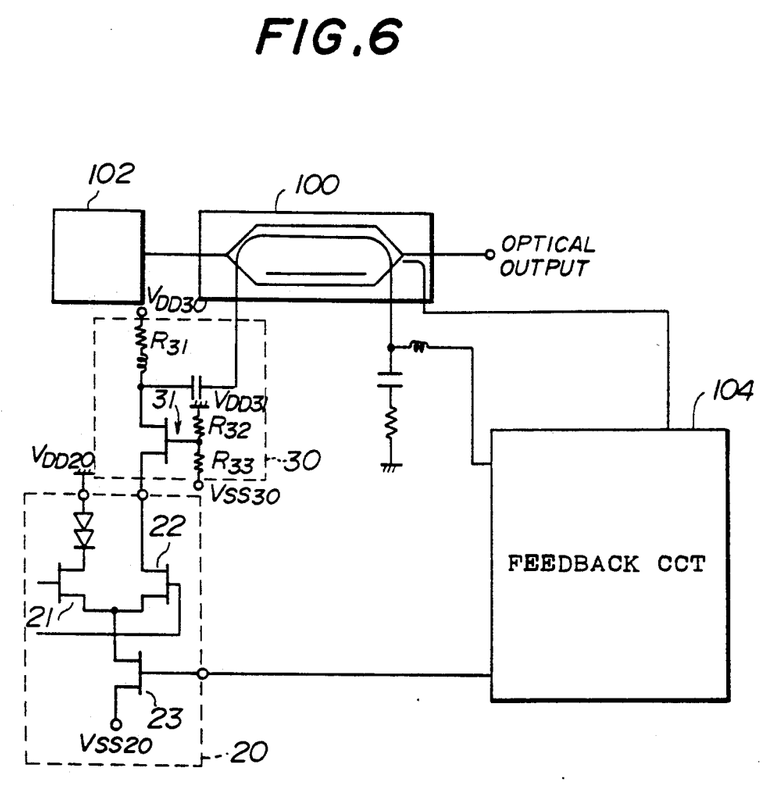
FIG. 6 is a diagram for explaining an application of the present invention.

Next, a description will be given of an application of the present invention, by referring to FIG. 6. In FIG. 6, those parts which are the same as those corresponding parts in FIG. 3 are designated by the same reference numerals, and a description thereof will be omitted.

In FIG. 6, an optical modulator 100 modulates a laser beam emitted from a laser diode 102 and produces an optical output. For example, the optical output of the optical modulator 100 is used to transmit information in an optical communication system. The optical modulator 100 needs to be driven by a relatively large driving voltage. For this reason, the semiconductor integrated circuit of the present invention is used to supply the output driving voltage $V_{30}$ of the driver part 30 to the optical modulator 100. In this particular case, the output signal of the optical modulator is fed back to the logic part 20 via a feedback circuit 104 in order to control the optical output of the optical modulator 100.

Of course, the load which may be driven by the output driving voltage of the driver part is not limited to the optical modulator, and the output driving voltage may be used to drive other kinds of loads.

Further, the present invention is not limited to these embodiments, but various variations and modifications may be made without departing from the scope of the present invention.

What is claimed is:

1. A semiconductor integrated circuit which receives an input signal of a first voltage level and produces in response thereto, and outputs, a driving signal of a second voltage level, higher than the first voltage level, for driving a load, said semiconductor integrated circuit comprising:
    a compound semiconductor substrate;
    a logic part operable at a first source voltage level correlated to the first voltage level of the input signal, the logic part receiving the input signal and comprising at least a first field effect transistor, formed on said compound semiconductor substrate, which is responsive to the input signal and outputs a first signal;
    a driver part, operable at a second source voltage level correlated to the second voltage level of the driving signal and which is coupled to said logic part for receiving the first signal, the driver part comprising at least a second field effect transistor, formed on said compound semiconductor substrate, which is responsive to the received first signal and outputs the driving signal;
    said first field effect transistor being a self-aligned type field effect transistor having a first gate electrode and first and second impurity regions which are formed in self-alignment with respect to the first gate electrode; and
    said second field effect transistor being a non-self-aligned type field effect transistor having a second gate electrode and third and fourth impurity regions which are formed in non-self-alignment with respect to the second gate electrode.

2. The semiconductor integrated circuit as claimed in claim 1, wherein said compound semiconductor substrate is made of GaAs.

3. A semiconductor integrated circuit for outputting a driving signal for driving a load, said semiconductor integrated circuit comprising:
    a compound semiconductor substrate;
    a logic part including a differential circuit, comprising first field effect transistors formed on said compound semiconductor substrate, and which outputs a first signal;
    a driver part, coupled to said logic part and comprising at least a second field effect transistor formed on said compound semiconductor substrate, the second field effect transistor being responsive to the first signal and outputting the driving signal;
    each of said first field effect transistors being a self-aligned type field effect transistor having a first gate electrode and first and second impurity regions formed in self-alignment with respect to the first gate electrode; and
    said second field effect transistor being a non-self-aligned type field effect transistor having a second gate electrode and third and fourth impurity regions formed in non-self-alignment with respect to the second gate electrode.

4. The semiconductor integrated circuit as claimed in claim 3, wherein said second field effect transistor has a source which receives the first signal from said differential circuit, a drain coupled to a first power source voltage and a gate coupled to a predetermined voltage, said driving signal being output from the drain of the second field effect transistor.

5. The semiconductor integrated circuit as claimed in claim 4, wherein said driver part further comprises a first resistor coupled between the drain of the second field effect transistor and the first power source voltage, a second resistor having one end coupled to a second power source voltage and another end coupled to a node, and a third resistor having one end coupled to a third power source voltage and another end coupled to the node, said node being coupled to the gate of the second field effect transistor.

6. A semiconductor integrated circuit for outputting a driving signal for driving a load, said semiconductor integrated circuit comprising:
    a compound semiconductor substrate;
    a logic part formed on said compound semiconductor substrate for outputting a first signal, said logic part including a differential circuit comprising self-aligned type first and second field effect transistors and a third field effect transistor, the first field effect transistor having a drain coupled to a first power source voltage, the first and second field effect transistors having respective sources coupled in common to a drain of the third field effect transistor, the third field effect transistor having a gate and a source coupled in common to a second power source voltage, and the second field effect transistor having a drain at which the first signal is output;

a driver part, coupled to said logic part, including at least a fourth field effect transistor formed on said compound semiconductor substrate, the fourth field effect transistor having a source coupled to the drain of second field effect transistor of said logic part and a drain and being responsive to the first signal, and the driver part outputting the driving signal from the drain of the fourth field effect transistor;

each of said first, second and third field effect transistors being a self-aligned type field effect transistor having a first gate electrode and first and second impurity regions formed in self-alignment with respect to the first gate electrode; and said fourth field effect transistor being a non-self-aligned type field effect transistor having a second gate electrode and third and fourth impurity regions formed in non-self-alignment with respect to the second gate electrode.

7. The semiconductor integrated circuit as claimed in claim 6, wherein said driver part further comprises a first resistor coupled between the drain of the fourth field effect transistor and a third power source voltage, a second resistor having one end coupled to a fourth power source voltage and another end coupled to a node, and a third resistor having one end coupled to a fifth power source voltage and another end coupled to the node, said node being coupled to the gate of the fourth field effect transistor.

* * * * *

UNITED STATES PATENT AND TRADEMARK OFFICE
CERTIFICATE OF CORRECTION

PATENT NO. : 5,256,915
DATED : October 26, 1993
INVENTOR(S) : Yoshiro NAKAYAMA

It is certified that error appears in the above-indentified patent and that said Letters Patent is hereby corrected as shown below:

Col. 1,  line 16, delete "increases" (both occurrences).

Col. 2,  line 21, delete "and";
         line 28, delete "to" (first occurrence).

Col. 3,  line 10, after "4B" insert --are--.

Signed and Sealed this

Eighteenth Day of October, 1994

Attest:

BRUCE LEHMAN

*Attesting Officer*      *Commissioner of Patents and Trademarks*